(12) United States Patent
Tahara et al.

(10) Patent No.: US 9,177,816 B2
(45) Date of Patent: *Nov. 3, 2015

(54) DEPOSIT REMOVAL METHOD (71) Applicants: TOKYO ELECTRON LIMITED, Minato-ku (JP); KABUSHIKI KAISHA TOSHIBA, Minato-ku (JP)

(72) Inventors: Shigeru Tahara, Kurokawa-gun (JP); Eiichi Nishimura, Kurokawa-gun (JP); Takanori Matsumoto, Yokkaichi (JP)

(73) Assignees: TOKYO ELECTRON LIMITED, Minato-ku (JP); KABUSHIKI KAISHA TOSHIBA, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/222,762

(22) Filed: Mar. 24, 2014

(65) Prior Publication Data
US 2014/0206198 A1    Jul. 24, 2014

Related U.S. Application Data (63) Continuation of application No. PCT/JP2012/006091, filed on Sep. 25, 2012.

(30) Foreign Application Priority Data

Sep. 29, 2011  (JP) .................................. 2011-213677

(51) Int. Cl.
*H01L 21/302* (2006.01)
*H01L 21/3065* (2006.01)
(Continued)

(52) U.S. Cl.
CPC ............ *H01L 21/3065* (2013.01); *B05D 3/145* (2013.01); *H01L 21/02057* (2013.01); *H01L 21/31116* (2013.01); *H01L 21/28* (2013.01); *H01L 21/76224* (2013.01)

(58) Field of Classification Search
CPC ................... H01L 21/02063; H01L 21/31116; B05D 3/145
See application file for complete search history.

(56) References Cited

U.S. PATENT DOCUMENTS

| 5,620,559 A | 4/1997 | Kikuchi |
| 6,124,209 A | 9/2000 | Habuka et al. |

(Continued)

FOREIGN PATENT DOCUMENTS

| CN | 1734724 A | 2/2006 |
| DE | 697 04 539 T2 | 10/2001 |

(Continued)

OTHER PUBLICATIONS

International Search Report issued on Dec. 18, 2012 for PCT/JP2012/006091 filed on Sep. 25, 2012 with English Translation.

(Continued)

*Primary Examiner* — Shamim Ahmed
*Assistant Examiner* — Bradford Gates
(74) *Attorney, Agent, or Firm* — Oblon, McClelland, Maier & Neustadt, L.L.P.

(57) ABSTRACT

One embodiment of the deposit removal method includes: preparing a substrate having a pattern on which a deposit is deposited, the pattern being formed by etching; exposing the substrate to a first atmosphere containing hydrogen fluoride gas; exposing the substrate to oxygen plasma while heating after the step of exposing the substrate to the first atmosphere; and exposing the substrate to a second atmosphere containing hydrogen fluoride gas to remove the deposit on the substrate after the step of exposing the substrate to the oxygen plasma.

10 Claims, 6 Drawing Sheets (51) Int. Cl.
  *H01L 21/311*  (2006.01)
  *B05D 3/14*  (2006.01)
  *H01L 21/02*  (2006.01)
  *H01L 21/762*  (2006.01)
  *H01L 21/28*  (2006.01)

(56) References Cited

U.S. PATENT DOCUMENTS

| 6,379,574 | B1 |  | 4/2002 | Ou-Yang et al. |  |
|---|---|---|---|---|---|
| 2002/0074312 | A1 |  | 6/2002 | Ou-Yang et al. |  |
| 2006/0011580 | A1 |  | 1/2006 | Shimizu |  |
| 2006/0207968 | A1 | * | 9/2006 | Mumbauer et al. | 216/58 |
| 2009/0275202 | A1 | * | 11/2009 | Tanaka et al. | 216/67 |
| 2009/0308843 | A1 | * | 12/2009 | O'Hara | 216/67 |
| 2011/0228370 | A1 | * | 9/2011 | Tsai et al. | 359/221.2 |

FOREIGN PATENT DOCUMENTS

| EP | 0 848 088 | A1 | 6/1998 |
|---|---|---|---|
| FR | 2 717 503 |  | 3/1995 |
| GB | 2 287 826 |  | 9/1995 |
| JP | 63-005532 |  | 1/1988 |
| JP | 05-304122 |  | 11/1993 |
| JP | 06-084852 | A | 3/1994 |
| JP | 07-263416 | A | 10/1995 |
| JP | 07-335602 | A | 12/1995 |
| JP | 10-233380 |  | 9/1998 |
| JP | 2000-049227 | A | 2/2000 |
| JP | 2001-007093 | A | 1/2001 |
| JP | 2006-012940 | A | 1/2006 |
| JP | 2007-115795 |  | 5/2007 |
| KR | 10-2006-0046505 | A | 5/2006 |
| TW | 418444 |  | 1/2001 |
| TW | 558765 |  | 10/2003 |

OTHER PUBLICATIONS

International Written Opinion issued on Dec. 18, 2012 for PCT/JP2012/006091 filed on Sep. 25, 2012.

* cited by examiner

DEPOSIT REMOVAL METHOD

CROSS-REFERENCE TO RELATED APPLICATIONS

This application is a continuation of prior International Application No. PCT/JP2012/006091 filed on Sep. 25, 2012, which is based upon and claims the benefit of priority from Japanese Patent Application No. 2011-213677, filed on Sep. 29, 2011; the entire contents of all of which are incorporated herein by reference. This application is also based on a Joint Research Agreement between Kabushiki Kaisha Toshiba and Tokyo Electron Limited.

FIELD

Embodiments of the present invention relate to a deposit removal method.

BACKGROUND

In a semiconductor device manufacturing field, to form desired patterns on a substrate such as a semiconductor wafer by applying a film deposition process and an etching process has been conventionally in practice. When a STI (Shallow Trench Isolation) process is carried out in such a semiconductor device manufacturing step, a deposit of a silicon oxide (for example, $SiO_2$ or SiOBr) is deposited on sidewall portions of the patterns. Conventionally, the removal of such a deposit has been performed by, for example, a process using single gas of hydrogen fluoride (HF).

However, when the composition and the bonding state of the deposit are close to those of silicon dioxide (for example, gate oxide films) being structures in the patterns, there is a problem that a selection ratio to these cannot be taken. Incidentally, water being a bi-product generated by a reaction between the deposit and hydrogen fluoride ($SiO_2 + 4HF \rightarrow SiF_4 + 2H_2O$) accelerates the reaction to cause a chain reaction, so that not only the deposit but also the silicon dioxide being the structures in the patterns is sometimes scraped away. Further, when the queuing time (q-time) after the etching process is long, the selection ratio sometimes becomes worse due to an influence of the water depending on a moisture absorption state of the deposit.

As an art to remove a natural oxide film formed on a surface of a silicon substrate, there has been known an art to use hydrogen fluoride vapor and $H_2O$ or alcohol vapor. However, this art is an art to remove the natural oxide film and is not an art to remove a deposit deposited on sidewall portions of patterns.

There has also been disclosed an art to continuously etch a polysilicon film under an etching condition having high etching selectivity after removing a natural oxide film formed on a surface of the polysilicon film by exposing the polysilicon film to hydrogen fluoride gas in a vacuum region. When the oxide film is etched by using etching gas containing carbon, an etching by-product containing a carbon-based substance adheres on the surface of the polysilicon film.

As described above, when the deposit deposited on the patterns is removed, there has conventionally been the problem that selectivity between the deposit and the silicon dioxide being the structure in the patterns is low, so that the silicon dioxide being the structure in the patterns is damaged. Further, there has been the problem, that, when the queuing time (q-time) after the etching process is long, the selection ratio further worsens due to the influence of water depending on the moisture absorption state of the deposit.

Further, detailed studies by the present inventors have led to the findings that using gas containing carbon as etching gas when silicon and film species before/after it are etched causes a problem that a deposit sometimes contains organic matter, and in this case, the method of removing the deposit of silicon oxide (for example, $SiO_2$ or SiOBr) cannot completely remove the deposit.

DETAILED DESCRIPTION

One embodiment of the deposit removal method includes: preparing a substrate having a pattern on which a deposit is deposited, the pattern being formed by etching; exposing the substrate to a first atmosphere containing hydrogen fluoride gas; exposing the substrate to oxygen plasma while heating after the step of exposing the substrate to the first atmosphere; and exposing the substrate to a second atmosphere containing hydrogen fluoride gas to remove the deposit on the substrate after the step of exposing the substrate to the oxygen plasma.

Hereinafter, details of the present invention will be described based on an embodiment with reference to the drawings.

Figure 1:
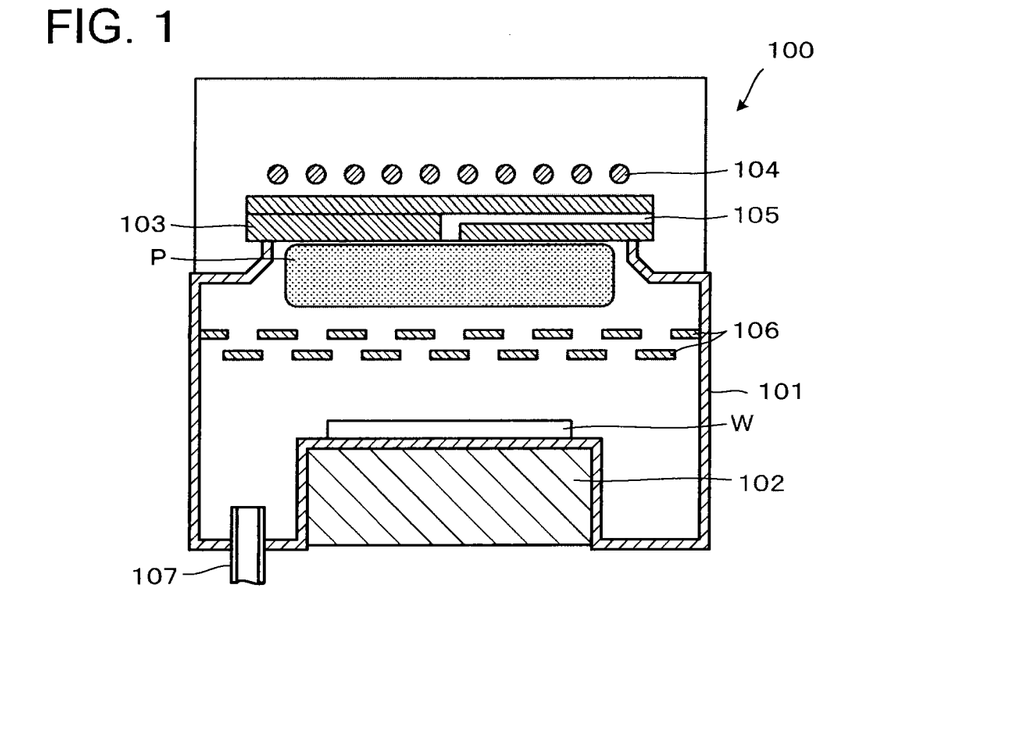
FIG. 1 is a view showing a schematic sectional structure of a plasma processing apparatus used in one embodiment of the present invention.

FIG. 1 is a vertical sectional view schematically showing a structure example of a plasma processing apparatus 100 used in an oxygen plasma process step in a deposit removal method of one embodiment of the present invention. As shown in the drawing, the plasma processing apparatus 100 includes a process chamber 101 whose interior can be airtightly closed. In the process chamber 101, a stage 102 where to place a semiconductor wafer (substrate) W is provided. The stage 102 includes a not-shown temperature control mechanism, and a temperature of the semiconductor wafer W placed on the stage 102 can be maintained at a predetermined temperature.

The process chamber 101 is made of, for example, quartz or the like, and in its ceiling portion, a window 103 made of quartz is formed. On an outer side of the window 103, a RF coil 104 connected to a not-shown high-frequency power source is connected. In a portion of the window 103, a gas lead-in part 105 for leading predetermined process gas containing oxygen gas (for example, single gas of $O_2$ gas) into the process chamber 101 is provided. Plasma P of the process gas led from the gas lead-in part 105 is generated by an action of a high-frequency power supplied to the RF coil 104.

Under the window 103, a gas diffusion plate 106 for intercepting the plasma and dispersing the gas is provided, and radicals in the plasma are supplied in a dispersed state to the semiconductor wafer W on the stage 102 via the gas diffusion plate 106. Incidentally, when the plasma is made to act on the substrate, the substrate and the plasma may be brought into contact with each other directly, or as in this embodiment, the radicals extracted from the plasma generated at a place apart from the substrate may be made to act on the substrate by a process using remote plasma, that is, instead of bringing the substrate and the plasma into contact directly.

Further, in a bottom portion of the process chamber 101, an exhaust pipe 107 is provided. This exhaust pipe 107 is connected to a not-shown vacuum pump or the like, and the interior of the process chamber 101 can be exhausted to a predetermined pressure.

Figure 2:
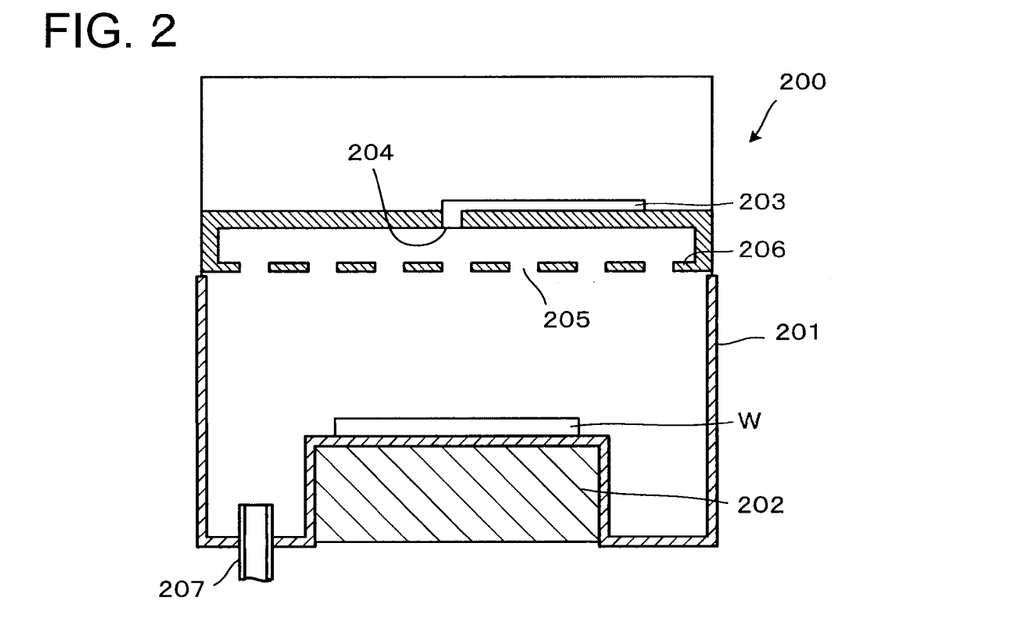
FIG. 2 is a view showing a schematic sectional structure of a gas processing apparatus used in the embodiment of the present invention.

FIG. 2 is a vertical sectional view schematically showing a structure example of a gas processing apparatus 200 used in steps of exposing the semiconductor wafer (substrate) W to an atmosphere containing hydrogen fluoride (HF) gas (a first process step and a second process step) in the deposit removal method of the embodiment of the present invention. As shown in the drawing, the gas processing apparatus 200 includes a process chamber 201 whose interior can be airtightly closed. In this process chamber 201, a stage 202 where to place the semiconductor wafer (substrate) W is provided. The stage 202 includes a not-shown temperature control mechanism, and a temperature of the semiconductor wafer W placed on the stage 202 can be kept at a predetermined temperature.

In an upper portion of the process chamber 201, a gas lead-in part 203 for leading predetermined process gas (in this embodiment mixed gas of hydrogen fluoride gas and methanol gas) into the process chamber 201 is provided. Further, under an opening portion 204 at which the gas lead-in part 203 is open to the process chamber 201, a gas diffusion plate 206 having many through holes 205 is provided, and the process gas is supplied in a uniformly dispersed state to a surface of the semiconductor wafer W from the through holes 205 of the gas diffusion plate 206.

Further, in a bottom portion of the process chamber 201, an exhaust pipe 207 is provided. This exhaust pipe 207 is connected to a not-shown vacuum pump or the like, and the interior of the process chamber 201 can be exhausted to a predetermined pressure.

In this embodiment, a deposit removal process is performed as follows by using the plasma processing apparatus 100 and the gas processing apparatus 200 having the above-described structures.

Figure 3:
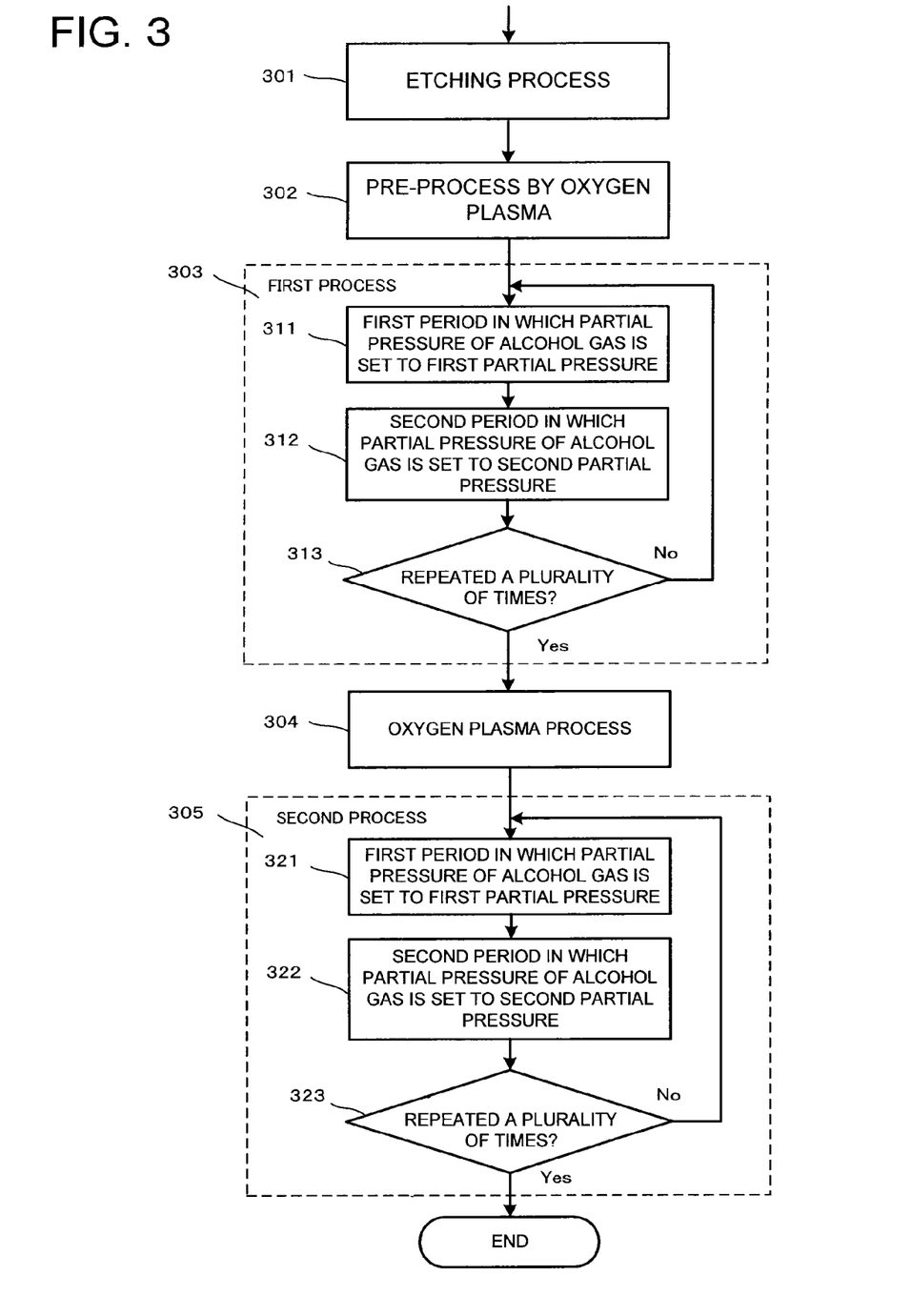
FIG. 3 is a flowchart showing steps in the embodiment of the present invention.
Figure 4:
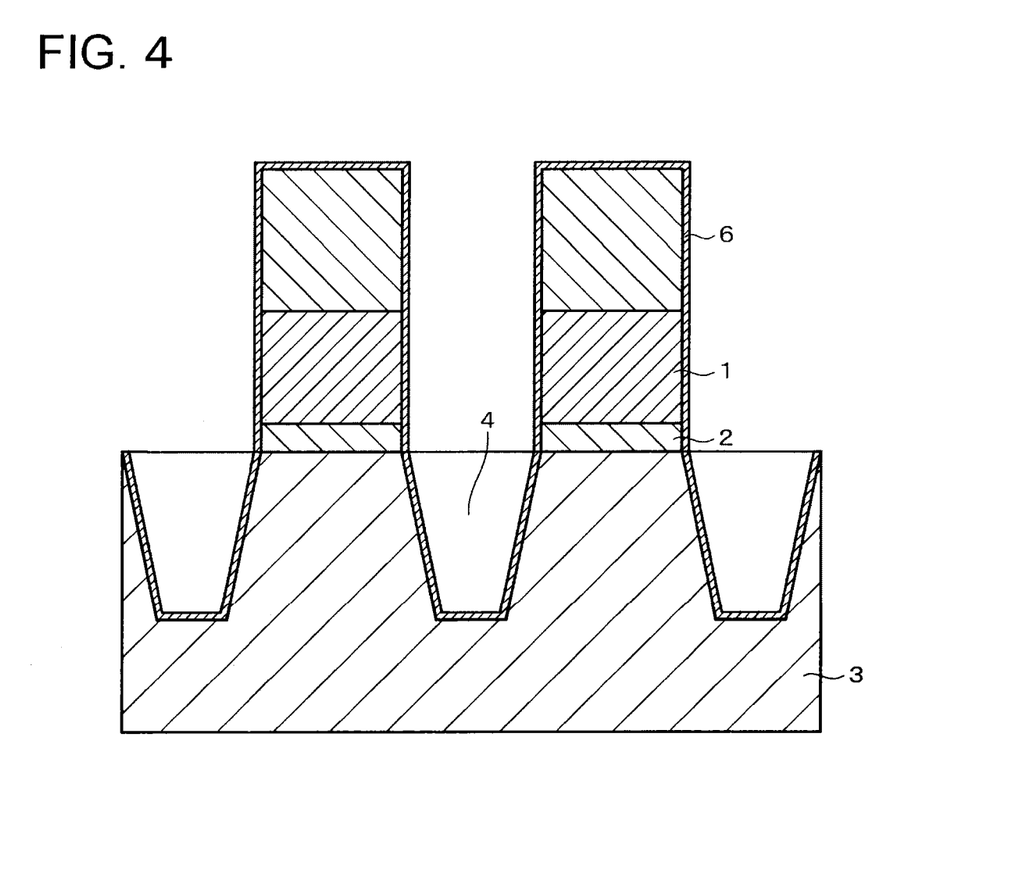
FIG. 4 is an enlarged view of a schematic sectional structure of a semiconductor wafer according to the embodiment of the present invention.

As shown in the flowchart in FIG. 3, an etching process is performed in a pre-step (Step 301), and on a semiconductor wafer on which predetermined patterns are formed, a deposit accompanying the etching process is deposited on sidewall portions of the patterns. For example, when a STI (Shallow Trench Isolation) process is executed, a deposit of a silicon oxide (for example, $SiO_2$ or SiOBr) is deposited on the sidewall portions of the patterns. So, the deposit deposited on the sidewall portions of the patterns is removed by the deposit removal process in this embodiment. FIG. 4 shows an example of an enlarged sectional structure of a semiconductor wafer having undergone such an etching process. As shown in FIG. 4, on a silicon substrate 3, a plurality of patterns which are each composed of a gate oxide film 2, a floating polysilicon film 1, and so on and which are formed to have a predetermined shape by patterning are formed, and on sides of these patterns, trenches (STI) 4 are formed. On sidewall portions of the patterns and in the trenches (STI) 4, a deposit 6 is adhering.

The aforesaid etching process (Step 301) is executed by using etching gas listed below, for instance.
 etching gas: $HBr/NF_3/CO/O_2$
 etching gas: $HBr/CF_4/CO/O_2$ As described above, when etching gas containing carbon is used as the etching gas, the deposit sometimes contains organic matter. When the deposit thus contains the organic matter, a deposit removal process using hydrogen fluoride gas or mixed gas of hydrogen fluoride gas and alcohol gas cannot sufficiently remove the deposit, and the deposit often remains on the sidewall portions of the patterns. Therefore, in this embodiment, as shown in the flowchart in FIG. 3, after the first process (Step 303) of exposing the semiconductor wafer (W) to the atmosphere containing the hydrogen fluoride gas is performed, the oxygen plasma process (Step 304) is performed, and thereafter, the second process (Step 305) of exposing the semiconductor wafer (W) to the atmosphere containing the hydrogen fluoride gas is performed.

Further, in this embodiment, prior to the aforesaid first process (Step 303), a pre-process by oxygen plasma (Step 302) is performed after the etching process. The pre-process by the oxygen plasma can be executed by the plasma processing apparatus 100 shown in FIG. 1 or the like.

The pre-process by the oxygen plasma is performed in order to make a moisture absorption state of the patterns and the deposit constant (dehydration) irrespective of the length of the queuing time (q-time) after the etching process. Consequently, an influence by a difference in the moisture absorption state is eliminated in later process steps, which makes it possible to remove a silicon oxide (for example, $SiO_2$ or SiOBr) being the deposit deposited on the sidewalls of the patterns and to prevent a $SiO_2$ layer such as a gate oxide film being a pattern structure from being damaged due to an excessive reaction. However, when the queuing time (q-time) after the etching process is short, this pre-process by the oxygen plasma may be skipped.

The pre-process by the oxygen plasma in the plasma processing apparatus 100 is executed as follows, for instance. Specifically, in the pre-process by the oxygen plasma, the semiconductor wafer W is placed on the stage 102 which is set to a predetermined temperature in advance, and is sucked by a not-shown electrostatic chuck or the like, so that the semiconductor wafer W is brought into a state of being heated to the predetermined temperature. In this state, the predetermined process gas containing the oxygen gas is led from the gas lead-in part 105 and the exhausting is performed from the exhaust pipe 107, so that the interior of the process chamber 101 is set to an atmosphere of the process gas with a predetermined pressure. Then, as a result of the application of the high-frequency power to the RF coil 104, inductively coupled plasma of the oxygen gas is generated. Ions in this plasma are intercepted by the gas diffusion plate 106 and oxygen radicals having no electric charge are supplied in a dispersed state to the semiconductor wafer W on the stage 102, and a process by the action of the oxygen radicals is performed.

In the pre-process by the oxygen plasma, as the process gas, gas containing oxygen, for example, single gas of oxygen gas, mixed gas of oxygen gas and nitrogen gas, or the like is used, and a heating temperature of the semiconductor wafer W (stage temperature) is set to about 200° C. to 300° C. Further, the pressure is set to about 66.5 Pa (0.5 Torr) to 266 Pa (2 Torr), for instance.

After the above-described pre-process by the oxygen plasma, the first process (Step 303) in the deposit removal process is executed. The first process is performed by exposing the semiconductor wafer (substrate) W to the atmosphere containing the hydrogen fluoride gas (in this embodiment, an atmosphere of mixed gas of hydrogen fluoride gas and alcohol gas), and can be executed by the gas processing apparatus 200 shown in FIG. 2 or the like.

The first process in the gas processing apparatus 200 is executed as follows, for instance. Specifically, the semiconductor wafer W is placed on the stage 202 which is set to a predetermined temperature in advance, so that the semiconductor wafer W comes into a state of being kept at the predetermined temperature. In this state, the predetermined process gas (in this embodiment, hydrogen fluoride gas+methanol gas) is led from the gas lead-in part 203 and the exhausting is performed from the exhaust pipe 207, so that the interior of the process chamber 201 is set to an atmosphere of the process gas with a predetermined pressure.

In this embodiment, in the first process (Step 303), a cycle made up of a first period (Step 311) in which a partial pressure of the alcohol gas (methanol gas) is set to a first partial pressure and a second period (Step 312) in which the interior of the process chamber is exhausted and the partial pressure of the alcohol gas (methanol gas) is set to a second partial pressure lower than the first partial pressure is repeated a plurality of times (Step 313), as shown in the flowchart in FIG. 3. As a method to thus change the partial pressure of the alcohol gas (methanol gas), the following methods are usable, for instance.

Specifically, they are a method in which the supply of the gas is changed, for example, in the first period, the mixed gas at a predetermined flow rate is supplied and in the second period, the supply of the mixed gas is stopped and nitrogen gas or the like at a predetermined flow rate is supplied, a method in which, in the first period, while the mixed gas at a predetermined flow rate is being supplied, the interior of the process chamber is kept at a predetermined pressure by an auto pressure controller (APC), and in the second period, while the pressure set by the auto pressure controller (APC) is reduced or it is fully opened, vacuuming is performed by the vacuum pump to lower the pressure, and so on. In this embodiment, the latter method is used to set the first period and the second period as shown in the graph in FIG. 5.

At this time, the temperature of the semiconductor wafer W is preferably set to a low temperature that is equal to or lower than several ten degrees (for example, 30° C.), for instance. Further, the pressure in the first period is preferably about 665 Pa (5 Torr) to 1330 Pa (10 Torr), for instance, and as the process gas, the mixed gas of the hydrogen fluoride gas+the alcohol gas (in this embodiment, the methanol ($CH_3OH$ gas)) is used.

In such a cycle process, in the first period, the partial pressure of the alcohol gas (methanol gas) is set to a partial pressure under which the deposit can be removed by the action of the mixed gas. Further, the second period is a period in which the partial pressure of the alcohol gas (methanol gas) is reduced, the deposit is not removed, and substances ($H_2O$ and so on) generated by a reaction of the deposit and the mixed gas during the first period are discharged out of the process chamber 201 by the exhausting. Such first period and second period each last about five seconds to twenty seconds, and this cycle is repeated a plurality of times.

Then, after the first process (Step 303) is executed by repeating the above-described cycle process a predetermined number of times, the oxygen plasma process (Step 304) is performed. This oxygen plasma process (Step 304) can be executed by the plasma processing apparatus 100 shown in FIG. 1 or the like.

The oxygen plasma process in the plasma processing apparatus 100 is executed as follows, for instance. Specifically, the semiconductor wafer W is placed on the stage 102 which is set to a predetermined temperature in advance, and is sucked by the not-shown electrostatic chuck or the like, so that the semiconductor wafer W comes into a state of being heated to the predetermined temperature. In this state, the predetermined process gas containing oxygen gas is led from the gas lead-in part 105 and the exhausting is performed from the exhaust pipe 107, so that the interior of the process chamber 101 is set to an atmosphere of the process gas with a predetermined pressure. Then, by the application of the high-frequency power to the RF coil 104, inductively coupled plasma of the oxygen gas is generated. Ions in this plasma are intercepted by the gas diffusion plate 106 and oxygen radicals having no electric charge are supplied in a dispersed state to the semiconductor wafer W on the stage 102, so that a process by the action of the oxygen radicals is performed. Consequently, it is possible to remove the deposit containing organic matter.

In this oxygen plasma process, as the process gas, gas containing oxygen, for example, single gas of oxygen gas, mixed gas of oxygen gas and nitrogen gas, or the like is used, and a heating temperature of the semiconductor wafer W (stage temperature) is set to about 200° C. to 300° C., for instance. Further, the pressure is set to about 66.5 Pa (0.5 Torr) to 266 Pa (2 Torr), for instance.

As shown in the flowchart in FIG. 3, after the above-described oxygen plasma process (Step S304) is performed, the second process (Step 305) is executed. This second process (Step 305) is performed by exposing the semiconductor wafer (substrate) W to the atmosphere containing the hydrogen fluoride gas (in this embodiment, an atmosphere of mixed gas of hydrogen fluoride gas and alcohol gas), and can be executed by the gas processing apparatus 200 shown in FIG. 2 or the like.

The second process in the gas processing apparatus 200 is executed as follows, for instance. Specifically, the semiconductor wafer W is placed on the stage 202 which is set to a predetermined temperature in advance, so that the semiconductor wafer W comes into a state of being kept at the predetermined temperature. In this state, the predetermined process gas (in this embodiment, the hydrogen fluoride gas+the methanol gas) is led from the gas lead-in part 203 and the exhausting is performed from the exhaust pipe 207, so that the interior of the process chamber 201 is set to an atmosphere of the process gas with a predetermined pressure.

In this embodiment, in the second process (Step 305), a cycle made up of a first period (Step 321) in which a partial pressure of the alcohol gas (methanol gas) is set to a first partial pressure and a second period (Step 322) in which the interior of the process chamber is exhausted and the partial pressure of the alcohol gas (methanol gas) is set to a second partial pressure lower than the first partial pressure is repeated a plurality of times (Step 323), as shown in the flowchart in FIG. 3. As a method to thus change the partial pressure of the methanol gas, the same method as that in the aforesaid first process (Step 303) is usable.

In the second process (Step 305), the temperature of the semiconductor wafer W is preferably set to a low temperature that is equal to or lower than several ten degrees (for example 30° C.), for instance. Further, the pressure in the first period is preferably about 665 Pa (5 Torr) to 1330 Pa (10 Torr), for instance, and as the process gas, the mixed gas of the hydrogen fluoride gas+the alcohol gas (in this embodiment, the methanol gas ($CH_3OH$ gas)) is used.

In such a cycle process, in the first period, the partial pressure of the methanol gas is set to a partial pressure under which the deposit can be removed by the action of the mixed gas. Further, the second period is a period in which the partial pressure of the methanol gas is reduced, the deposit is not removed, and substances ($H_2O$ and so on) generated by a reaction of the deposit and the mixed gas during the first period are discharged out of the process chamber 201 by the exhausting. Such first period and second period each last about five seconds to twenty seconds, and this cycle is repeated a plurality of times.

Then, when the number of times of the cycle process (Steps 321 to 323) in the second process (Step 305) reaches a predetermined number of times, the deposit removal process is finished.

As described above, in this embodiment, after the first process (Step 303) is performed, the oxygen plasma process (Step 304) is performed, and thereafter the second process (Step 305) is performed, thereby making it possible to remove the deposit even when the deposit contains organic matter.

Further, in this embodiment, owing to the pre-process by the oxygen plasma, the moisture absorption state of the patterns and the deposit is constant irrespective of the length of the queuing time (q-time) after the etching process. Here, performing the pre-process by the oxygen plasma makes it difficult to remove the deposit by a process using single gas of hydrogen fluoride (HF). Therefore, in the first process and the second process in this embodiment, the mixed gas of the hydrogen fluoride gas+the alcohol gas (in this embodiment, the methanol gas) is used. In this case, an amount of $H_2O$ generated by the reaction becomes excessive, so that there sometimes occurs a case where a gate oxide film or the like being a pattern structure is damaged or a deposit (re-deposit) is generated by an inverse reaction. Therefore, in the first process and the second process, the first period where the deposit is removed and the second period where the reaction by-product is discharged without the removal of the deposit being performed are repeated by the cycle process, whereby an amount of $H_2O$ is prevented from becoming excessive.

Consequently, it is possible to remove the deposit (silicon oxide (for example, $SiO_2$ or SiOBr) and organic matter) deposited on the sidewalls of the patterns, and it is possible to prevent the $SiO_2$ layer such as the gate oxide film being the pattern structure from being damaged due to an excessive progress of the reaction by a catalytic action by $H_2O$.

As an example, after the pre-process by the oxygen plasma was applied on a semiconductor wafer on which patterns were formed by etching, the removal of a deposit was performed. The pre-process by the oxygen plasma was performed under the following process condition.
pressure: 133 Pa (1 Torr)
high-frequency power: 1000 W
process gas: $O_2$=2000 sccm
stage temperature: 250° C.
time: 120 seconds Next, the first process was performed under the following process condition.
pressure: (931 Pa (7 Torr) ten seconds ⇔ 173 Pa (1.3 Torr) 10 seconds)×three cycles
process gas: $HF/CH_3OH$=2800/65 sccm
stage temperature: 10° C.

Figure 5:
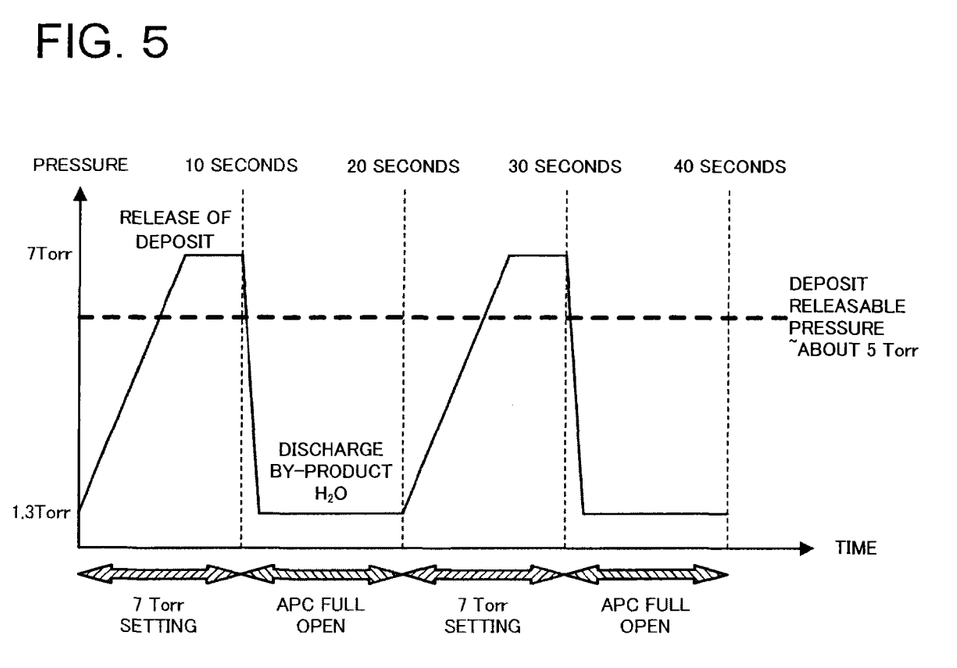
FIG. 5 is a graph showing a state of a pressure change in the embodiment of the present invention.

Incidentally, as for the pressure setting in the above cycle process, in the first period, the time during which the pressure setting by APC is 931 Pa (7 Torr) is kept for 10 seconds, and in the second period, the state where APC is fully opened while the process gas is supplied is kept for ten seconds, as previously described, and an actual pressure change in the process chamber 201 is as shown in the graph in FIG. 5. Specifically, even when the pressure setting by APC is changed to 931 Pa (7 Torr) from the state where APC is fully opened, it takes about four to five seconds for the actual pressure to reach 931 Pa (7 Torr). Further, when the pressure setting by APC is changed to the full open state from 931 Pa (7 Torr), the pressure becomes constant at about 173 Pa (1.3 Torr) in a relatively short time.

Here, under the above-described condition of the stage temperature and the flow rate of the process gas, a pressure at which the partial pressure of the methanol gas reaches the pressure enabling the deposit removal (deposit release) is about 665 Pa (5 Torr). Therefore, the time of a ½ cycle in the cycle process in this case is preferably about five to twenty seconds. Note that the first period and the second period do not necessarily have to be the same and may be different.

Next, the oxygen plasma process was performed under the following process condition.
pressure: 133 Pa (1 Torr)
high-frequency power: 1000 W
process gas: $O_2$=2000 sccm
stage temperature: 250° C.
time: thirty seconds Next, the second process was performed under the following process condition.
pressure: (931 Pa (7 Torr) ten seconds ⇔ 173 Pa (1.3 Torr) ten seconds)×three cycles
process gas: $HF/CH_3OH$=2800/65 sccm
stage temperature: 10° C.

Figure 6:
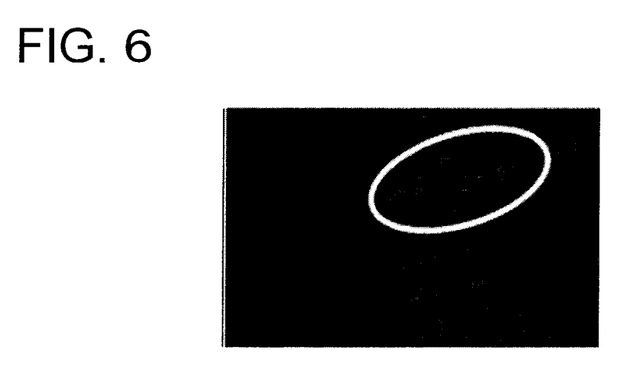
FIG. 6 is an electron micrograph showing a state of a semiconductor wafer according to an example.

When the semiconductor wafer having undergone the above deposit removal was enlarged and observed by an electron microscope (SEM), a deposit deposited on sidewall portions of patterns was removed, and a $SiO_2$ layer such as a gate oxide film being a pattern structure was not damaged. A photograph of the semiconductor wafer by the electron microscope (SEM) in this example is shown in FIG. 6.

Figure 7:
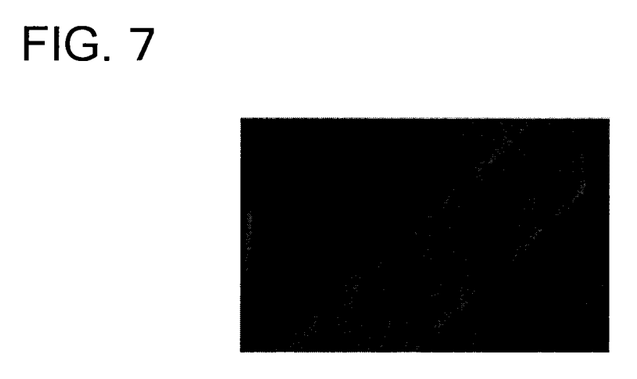
FIG. 7 is an electron micrograph showing a state of a semiconductor wafer according to a comparative example.

On the other hand, as a comparative example, when the cycle process in the first process (Step 303) was performed six times without performing the oxygen plasma process (Step 304) and the second process (Step 305) in the example, a deposit remained on sidewall portions of patterns, and it was not possible to completely remove the deposit. A photograph of a semiconductor wafer by an electron microscope (SEM) in this comparative example is shown in FIG. 7. In the photograph in FIG. 7, the deposit remaining on the sidewalls of the patterns appears white. Incidentally, when the cycle process was repeated twelve times in the above-described comparative example, the deposit also remained on the sidewall portions of the patterns, and it was not possible to completely remove the deposit.

Next, the result of studies on a process condition under which a deposit can be removed will be described. First, in studies on a relation between an addition amount of methanol gas in a process gas and a release force of the deposit, when 100 sccm of the methanol gas was added to a sample whose deposit could not be removed when the methanol gas was not added, it was possible to remove the deposit. Further, it could be confirmed that increasing the addition amount of the methanol gas to 200 sccm resulted in an increase in the release force of the deposit. However, in this experiment, since a gas process was continuously performed without performing a cycle process, a gate oxide film being a structure of patterns was scraped away and was damaged.

Further, in order to study a relation between pressure of a process gas and a release force of a deposit, the removal of a deposit of a sample was performed, with the pressure being set to 665 Pa (5 Torr), 1330 Pa (10 Torr), and 1995 Pa (15 Torr). As a result, it could be confirmed that increasing the pressure resulted in an increase in the release force of the deposit. However, in this experiment, since a gas process was continuously performed without performing a cycle process, a gate oxide film being a structure of patterns was scraped away and was damaged.

Further, in order to study a relation between temperature and a release force of a deposit, the removal of a deposit of a sample was performed, with the temperature being set to 10° C., 30° C., and 50° C. As a result, it could be confirmed that decreasing the temperature resulted in an increase in the release force of the deposit. However, in this experiment, since a gas process was continuously performed without performing a cycle process, a gate oxide film being a structure of patterns was scraped away and was damaged.

Figure 8:
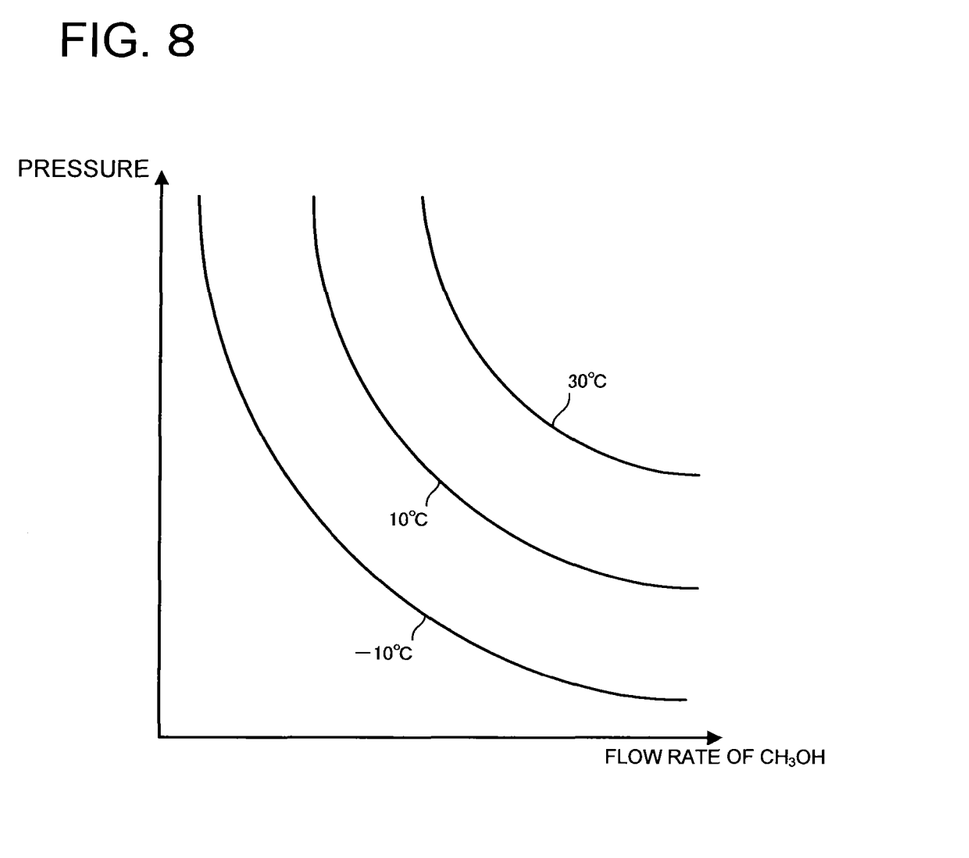
FIG. 8 is a graph showing a relation of pressure, a methanol gas flow rate, and temperature under which a deposit can be removed.

From the above results, a boundary line separating a region where the removal of the deposit progresses and a region where the removal of the deposit does not progress can be found for each process temperature, as shown in the graph in FIG. 8 where the vertical axis represents pressure and the horizontal axis represents a flow rate of the methanol gas. Then, by changing the process condition (the pressure or the flow rate of the methanol gas, or the both) so as to cross this boundary line, it is possible to set the first period in which the methanol gas has a partial pressure under which the removal of the deposit in the cycle process is performed and the second period in which the methanol gas has a partial pressure under which the deposit is not removed.

Hitherto, the embodiment and the example of the present invention are described, but the present invention is not limited to the above-described embodiment and example, and it is a matter of course that various kinds of modifications can be made therein. For example, though the case where the pre-process by the oxygen plasma is performed is described in the above embodiment and example, the pre-process by the oxygen plasma may be skipped. Further, when the pre-process by the oxygen plasma is skipped, the gas used in the first process step and the second process step can be single gas of hydrogen fluoride not containing alcohol, and in this case, a process with the pressure being set constant can be performed without performing the cycle process. Further, though the case where the methanol gas is used as the alcohol gas is described in the above embodiment and example, other alcohol gas, for example, ethanol gas, isopropyl alcohol gas, or the like may be used.

As described above, the deposit removal method can efficiently remove deposit even when the deposit contains organic matter.

The deposit removal method of the present invention is usable in semiconductor device manufacturing fields and the like. Therefore, it has industrial applicability.

The present invention has been described in detail while referring to specific embodiments, but, it is obvious for a person skilled in the art that the invention can be variously modified and changed without departing from the scope and the spirit of the present invention.

What is claimed is:

1. A deposit removal method, comprising:
preparing a substrate having a pattern on which a deposit is deposited, the pattern being formed by etching;
exposing the substrate to oxygen plasma while heating; and
exposing the substrate to a mixed gas of hydrogen fluoride gas and alcohol gas in a chamber while repeating a first period and a second period alternately after the step of exposing the substrate to the oxygen plasma,
wherein a first partial pressure of alcohol gas in the chamber in the first period enables removal of the deposit by the mixed gas, a second partial pressure of alcohol gas in the chamber in the second period being lower than the first partial pressure,
wherein the first and second periods are about 5 to 20 seconds, and
wherein the first and second partial pressures are adjusted by controlling a pumping rate while supplying the mixed gas at a fixed flow rate.

2. The deposit removal method according to claim 1, wherein the deposit contains a silicon oxide and organic matter.

3. The deposit removal method according to claim 2, wherein the organic matter in the deposit is formed when gas containing carbon is used in the etching for forming the pattern.

4. The deposit removal method according to claim 1, wherein the pattern contains silicon dioxide as a structure.

5. The deposit removal method according to claim 1, wherein a pressure in the chamber in the first period is 5 Torr to 7 Torr.

6. The deposit removal method according to claim 1, wherein a pressure in the chamber in the second period is 1.3 Torr to 5 Torr.

7. The deposit removal method according to claim 1, wherein a temperatures of the substrate in the first and second periods are 10° C. to 30° C.

8. The deposit removal method according to claim 1, further comprising:
exposing the substrate to second oxygen plasma while heating after the step of exposing the substrate to the mixed gas.

9. The deposit removal method according to claim 8, further comprising:
exposing the substrate to a second mixed gas of hydrogen fluoride gas and alcohol gas in the chamber while repeating a third period and a fourth period alternately after the step of exposing the substrate to the second oxygen plasma,
wherein a third partial pressure of alcohol gas in the chamber in the third period enabling removal of the deposit by the second mixed gas, a fourth partial pressure of alcohol gas in the chamber in the fourth period being lower than the third partial pressure,
wherein the third and fourth periods are about 5 to 20 seconds, and
wherein the third and fourth partial pressures are adjusted by controlling the pumping rate while supplying the second mixed gas at a fixed flow rate.

10. The deposit removal method according to claim 1, wherein the controlling of the pumping rate is achieved by adjusting an opening degree of an automatic pressure controller.

* * * * *